(12) United States Patent
Shih et al.

(10) Patent No.: US 8,454,787 B2
(45) Date of Patent: Jun. 4, 2013

(54) METHOD FOR MAKING PATTERNED CONDUCTIVE ELEMENT

(75) Inventors: Po-Sheng Shih, New Taipei (TW); Jia-Shyong Cheng, New Taipei (TW)

(73) Assignee: Shih Hua Technology Ltd., Zhubei, Hsinchu County (TW)

( * ) Notice: Subject to any disclaimer, the term of this patent is extended or adjusted under 35 U.S.C. 154(b) by 14 days.

(21) Appl. No.: 13/339,700

(22) Filed: Dec. 29, 2011

(65) Prior Publication Data

US 2012/0312464 A1  Dec. 13, 2012

(30) Foreign Application Priority Data

Jun. 9, 2011 (TW) .............................. 100120201 A

(51) Int. Cl.
*B29C 65/52* (2006.01)
*B32B 37/12* (2006.01)
*B32B 37/24* (2006.01)
*B32B 37/30* (2006.01)
*B32B 38/10* (2006.01)

(52) U.S. Cl.
USPC ...................... 156/247; 156/272.2; 156/273.3; 156/273.9

(58) Field of Classification Search
USPC ................ 156/247, 249, 272.2, 272.8, 273.3, 156/273.9
See application file for complete search history.

(56) References Cited

U.S. PATENT DOCUMENTS

| | | | |
|---|---|---|---|
| 6,440,761 B1 * | 8/2002 | Choi ............................... | 438/20 |
| 6,988,925 B2 * | 1/2006 | Arthur et al. ..................... | 445/46 |
| 7,393,699 B2 * | 7/2008 | Tran ................................. | 438/1 |
| 7,520,951 B1 * | 4/2009 | Wolf et al. ...................... | 156/235 |
| 7,569,331 B2 * | 8/2009 | Dorogy et al. ................. | 430/311 |
| 7,875,313 B2 * | 1/2011 | Blanchet et al. ............... | 427/282 |
| 8,012,815 B2 * | 9/2011 | Shih et al. ...................... | 438/155 |
| 8,202,505 B2 * | 6/2012 | Hata et al. ................... | 423/447.2 |
| 2004/0043219 A1 * | 3/2004 | Ito et al. ......................... | 428/408 |
| 2004/0099438 A1 * | 5/2004 | Arthur et al. ................... | 174/257 |
| 2004/0104660 A1 * | 6/2004 | Okamoto et al. ......... | 313/346 R |
| 2005/0164132 A1 * | 7/2005 | Moll et al. ..................... | 430/322 |
| 2005/0209392 A1 * | 9/2005 | Luo et al. ....................... | 524/496 |
| 2005/0221083 A1 * | 10/2005 | Belcher et al. ................ | 428/364 |
| 2006/0188721 A1 * | 8/2006 | Irvin et al. ..................... | 428/402 |
| 2006/0283539 A1 * | 12/2006 | Slafer ........................... | 156/230 |
| 2008/0018850 A1 * | 1/2008 | Shih et al. ...................... | 349/152 |
| 2008/0308209 A1 * | 12/2008 | Loutfy et al. ................. | 156/62.2 |
| 2009/0130607 A1 * | 5/2009 | Slafer ........................... | 430/323 |
| 2009/0160799 A1 * | 6/2009 | Jiang et al. .................... | 345/173 |
| 2009/0267000 A1 * | 10/2009 | Chen et al. ................. | 250/492.1 |
| 2009/0272560 A1 * | 11/2009 | Tokunaga .................. | 174/126.1 |
| 2009/0272935 A1 * | 11/2009 | Hata et al. ....................... | 252/70 |
| 2010/0159219 A1 * | 6/2010 | Park et al. ..................... | 428/206 |
| 2010/0221172 A1 * | 9/2010 | Maeda et al. ................. | 423/439 |
| 2010/0253317 A1 * | 10/2010 | Gritters et al. ............... | 174/261 |
| 2011/0011528 A1 * | 1/2011 | Wu et al. ....................... | 156/247 |
| 2011/0277321 A1 * | 11/2011 | Inoue et al. ..................... | 29/846 |
| 2011/0303911 A1 * | 12/2011 | Fujii et al. ...................... | 257/40 |
| 2011/0312587 A1 * | 12/2011 | Silverbrook et al. ........... | 506/16 |

(Continued)

*Primary Examiner* — Sing P Chan

(74) *Attorney, Agent, or Firm* — Altis Law Group, Inc.

(57) ABSTRACT

A method for making a patterned conductive element includes following steps. A substrate is provided. A patterned adhesive layer is applied on a surface of the substrate. A carbon nanotube layer is placed on a surface of the patterned adhesive layer. The patterned adhesive layer is solidified to obtain a fixed part of the carbon nanotube layer and a non-fixed part of carbon nanotube layer. The non-fixed part of carbon nanotube layer is removed.

20 Claims, 6 Drawing Sheets

U.S. PATENT DOCUMENTS

2012/0025427 A1* 2/2012 Chen et al. .................... 264/400
2012/0132587 A1* 5/2012 Durda et al. .................. 210/615
2012/0312464 A1* 12/2012 Shih et al. ..................... 156/247
2012/0312773 A1* 12/2012 Cheng et al. .................... 216/13

* cited by examiner

METHOD FOR MAKING PATTERNED CONDUCTIVE ELEMENT

CROSS-REFERENCE TO RELATED APPLICATIONS

This application claims all benefits accruing under 35 U.S.C. §119 from Taiwan Patent Application No. 100120201, filed on Jun. 9, 2011, in the Taiwan Intellectual Property Office, the contents of which are hereby incorporated by reference. This application is related to applications entitled, "TOUCH PANEL", filed Dec. 29, 2011 Ser. No. 13/339,643; and "METHOD FOR MAKING TOUCH PANEL", filed Dec. 29 2011 Ser. No. 13/339,658; and "METHOD FOR MAKING TOUCH PANEL", filed Dec. 29, 2011 Ser. No. 13/339,664; and "METHOD FOR MAKING TOUCH PANEL", filed Dec. 29, 2011 Ser. No. 13/339,671; and "TOUCH PANEL AND METHOD FOR MAKING THE SAME", filed Dec. 29, 2011 Ser. No. 13/339,678; and "METHOD FOR MAKING TOUCH PANEL", filed Dec. 29, 2011 Ser. No. 13/339,681; and "METHOD FOR MAKING TOUCH PANEL", filed Dec. 29, 2011 Ser. No. 13/339,688; and "PATTERNED CONDUCTIVE ELEMENT", filed Dec. 29, 2011 Ser. No. 13/339,696; and "METHOD FOR MAKING PATTERNED CONDUCTIVE ELEMENT", filed Dec. 29, 2011 Ser. No. 13/339,703; and "TOUCH PANEL", filed Dec. 29, 2011 Ser. No. 13/339,709; and "TOUCH PANEL", filed Dec. 29, 2011 Ser. No. 13/339,718.

BACKGROUND

1. Technical Field

The present disclosure relates to methods for making patterned conductive elements, particularly, to a method for making a carbon nanotube based patterned conductive element.

2. Description of Related Art

Patterned conductive elements, especially patterned transparent conductive elements, are widely used in the electronic devices such as a touch screen, a liquid crystal display (LCD), or a field emission display (FED).

A conventional patterned transparent conductive element includes a patterned transparent conductive indium tin oxide (ITO). However, the ITO layer has poor wearability, low chemical endurance and uneven resistance in an entire area of the panel. Furthermore, the ITO layer is generally formed by means of ion-beam sputtering and etched by laser beam, and the method is relatively complicated.

What is needed, therefore, is to provide a patterned conductive element and a method for making the same which can overcome the shortcoming described above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present methods for making the patterned conductive element.

Figure 1:
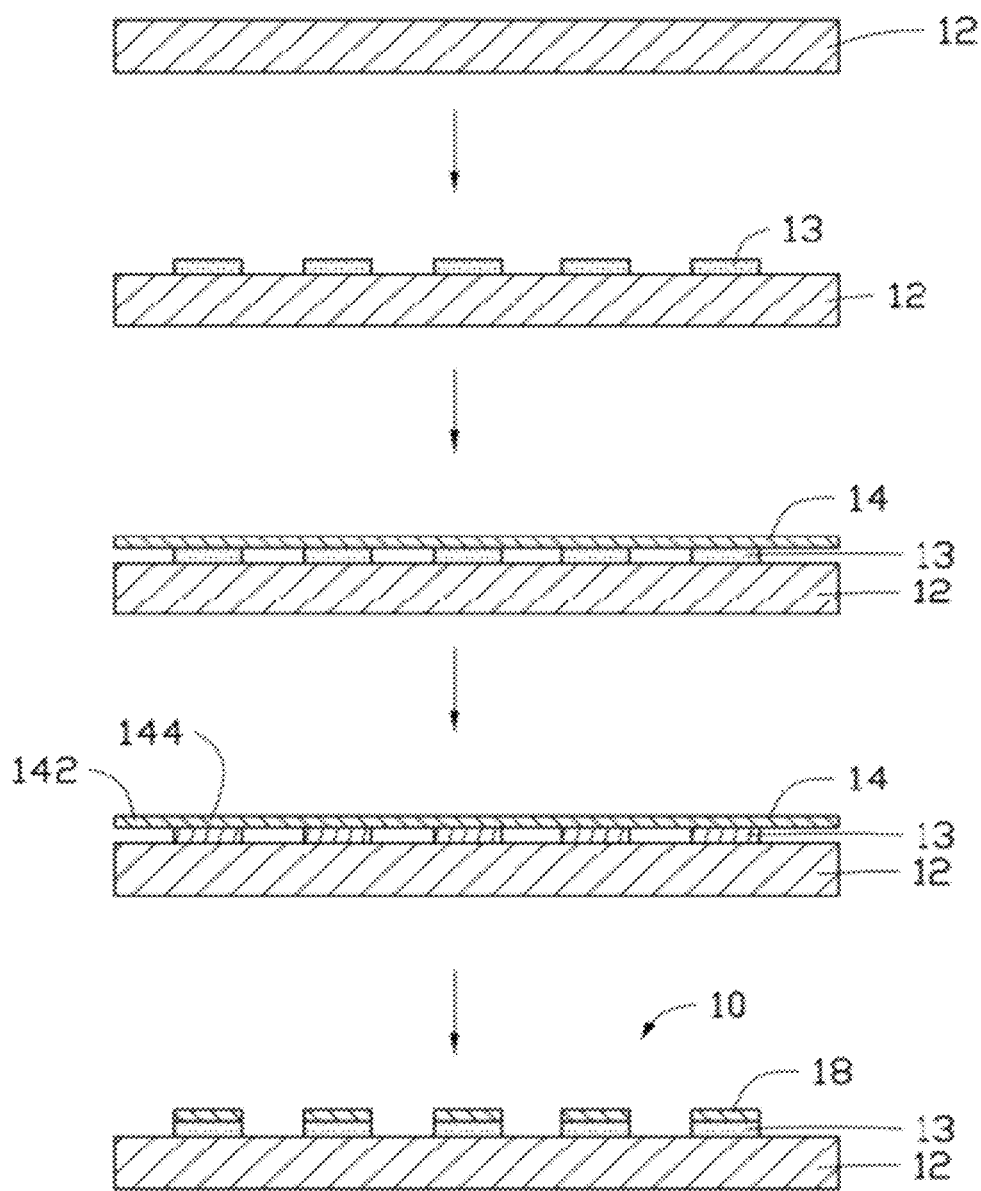
FIG. 1 is a flowchart of one embodiment of a method for making a patterned conductive element.

Referring to FIG. 1, a method for making a patterned conductive element 10 of one embodiment includes the steps of:

step (S10), providing a substrate 12;
step (S20), applying a patterned adhesive layer 13 on a surface of the substrate 12;
step (S30), placing a carbon nanotube layer 14 on a surface of the patterned adhesive layer 13;
step (S40), solidifying the patterned adhesive layer 13 to fix the carbon nanotube layer 14 to obtain a fixed part 144 of the carbon nanotube layer 14 and a non-fixed part 142 of carbon nanotube layer 14; and
step (S50), removing the non-fixed part 142 of carbon nanotube layer 14 to obtain a patterned carbon nanotube layer 18.

In step (S10), the substrate 12 can be flat or curved and configured to support other elements. The substrate 12 can be insulative and transparent, opaque, or translucent. The substrate 12 can be made of rigid materials such as silicon, ceramic, glass, quartz, diamond, plastic or any other suitable material. The substrate 12 can also be made of flexible materials such as polycarbonate (PC), polymethyl methacrylate acrylic (PMMA), polyimide (PI), polyethylene terephthalate (PET), polyethylene (PE), polyether polysulfones (PES), polyvinyl polychloride (PVC), benzocyclobutenes (BCB), polyesters, or acrylic resin. The transmittance of the substrate 12 can be greater than 75%. In one embodiment, the substrate 12 is a flat glass plate.

In step (S20), the patterned adhesive layer 13 can be any adhesive which can be solidified on a certain condition. The patterned adhesive layer 13 can be transparent, opaque, or translucent. In one embodiment, the transmittance of the patterned adhesive layer 13 can be greater than 75%. The patterned adhesive layer 13 is transparent and can be made of materials such as hot plastic or UV glue, for example PVC or PMMA. The thickness of the patterned adhesive layer 13 can be in a range from about 1 nanometer to about 500 micrometers, for example, the thickness is in a range from about 1 micrometer to about 2 micrometers. In one embodiment, the patterned adhesive layer 13 is a UV glue layer with a thickness of 1.5 micrometers.

Figure 2:
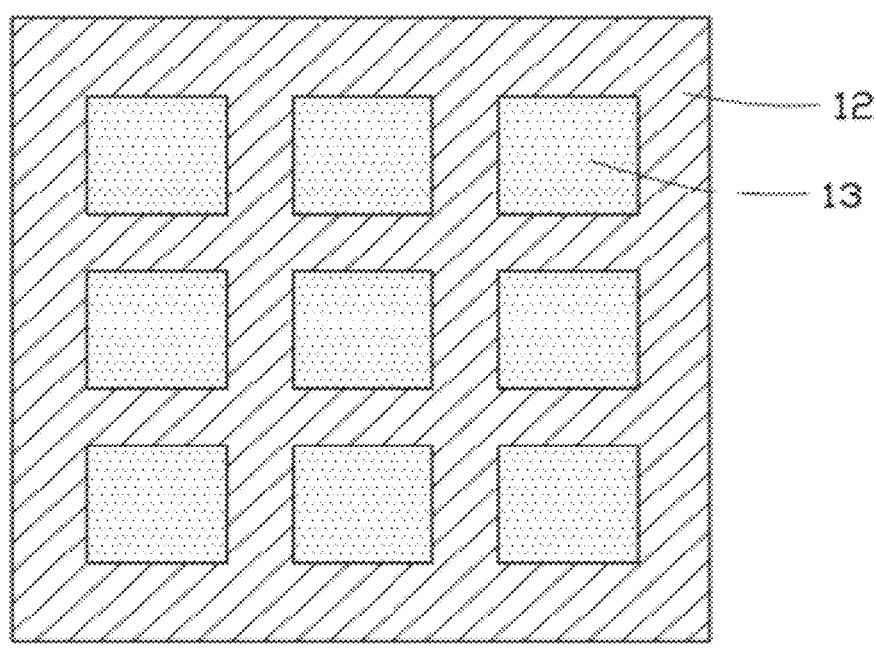
FIG. 2 is a schematic, top view of one embodiment of a patterned adhesive layer including a plurality of adhesive units having the same shape.
Figure 3:
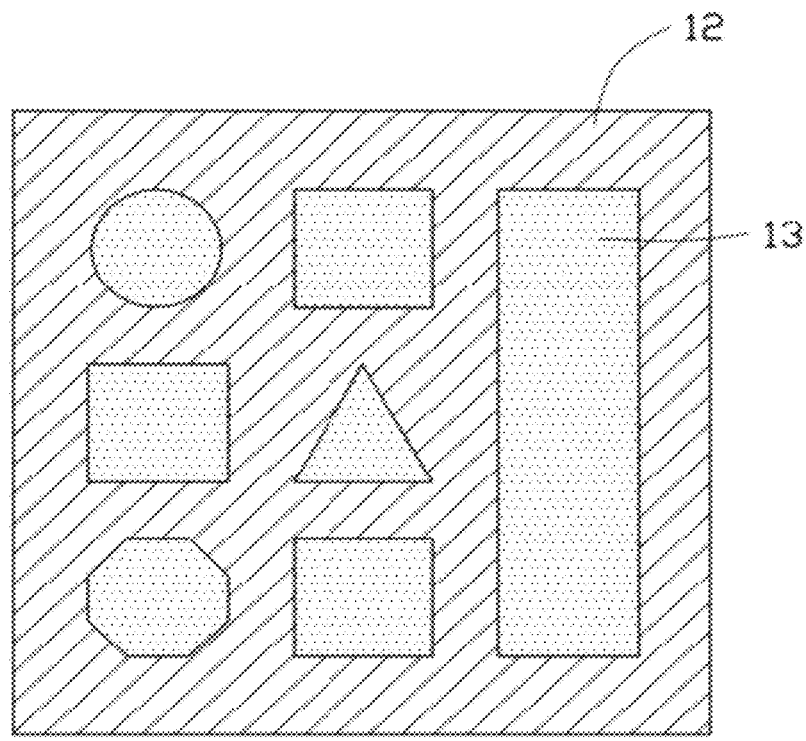
FIG. 3 is a schematic, top view of another embodiment of a patterned adhesive layer including a plurality of adhesive units having different shapes.

The patterned adhesive layer 13 can be a continuous integrated structure or include a plurality of adhesive units spaced from each other and arranged in the form of an array. The plurality of adhesive units can be hexagonally arranged, squarely arranged, or concentrically arranged. The shape of the adhesive unit can be a triangle, parallelogram, diamond, square, trapezoid, rectangle, or circle. In one embodiment, the patterned adhesive layer 13 includes a plurality of adhesive units having the same shape as shown in FIG. 2. In one embodiment, the patterned adhesive layer 13 includes a plurality of adhesive units having different shapes as shown in FIG. 3.

The patterned adhesive layer 13 can be formed directly by spin-coating, spraying, or brushing. Also, the patterned adhesive layer 13 can be formed by coating a non-patterned adhesive layer to cover the entire substrate 12 first and then removing part of the non-patterned adhesive layer. Removing part of the non-patterned adhesive layer can be performed by laser etching or mechanical polishing. In one embodiment, a plurality of stripe-shaped UV glue layers is formed on the substrate 12 by brushing. The plurality of stripe-shaped UV glue layers is in parallel and spaced from each other.

In step (S30), the carbon nanotube layer 14 can be formed by transfer printing a preformed carbon nanotube film, filtering and depositing a carbon nanotube suspension, or laying a free-standing carbon nanotube film. In one embodiment, the carbon nanotube film is drawn from a carbon nanotube array and then placed on the patterned adhesive layer 13 directly.

The carbon nanotube layer 14 includes a plurality of carbon nanotubes. The carbon nanotube layer 14 can be a substantially pure structure of the carbon nanotubes, with few impurities and chemical functional groups. A majority of the carbon nanotubes are arranged to extend along the direction substantially parallel to the surface of the carbon nanotube layer 14. The carbon nanotubes in the carbon nanotube layer 14 can be single-walled, double-walled, or multi-walled carbon nanotubes. The length and diameter of the carbon nanotubes can be selected according to need, for example the diameter can be in a range from about 0.5 nanometers to about 50 nanometers and the length can be in a range from about 200 nanometers to about 900 nanometers. The thickness of the carbon nanotube layer 14 can be in a range from about 0.5 nanometers to about 100 micrometers, for example in a range from about 100 nanometers to about 200 nanometers. The carbon nanotube layer 14 has a good flexibility because of the good flexibility of the carbon nanotubes therein.

The carbon nanotubes of the carbon nanotube layer 14 can be arranged orderly to form an ordered carbon nanotube structure or disorderly to form a disordered carbon nanotube structure. The term 'disordered carbon nanotube structure' includes, but is not limited to, to a structure where the carbon nanotubes are arranged along many different directions, and the aligning directions of the carbon nanotubes are random. The number of the carbon nanotubes arranged along each different direction can be almost the same (e.g. uniformly disordered). The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotube layer 14 is a free-standing structure. The term "free-standing structure" means that the carbon nanotube layer 14 can sustain the weight of itself when it is hoisted by a portion thereof without any significant damage to its structural integrity. Thus, the carbon nanotube layer 14 can be suspended by two spaced supports.

The carbon nanotube layer 14 includes at least one free-standing carbon nanotube film. The free-standing carbon nanotube film can be drawn from a carbon nanotube array and then placed on the patterned adhesive layer 13 directly and easily. In one embodiment, the carbon nanotube film can be made by the steps of: growing a carbon nanotube array on a wafer by chemical vapor deposition method; and drawing the carbon nanotubes of the carbon nanotube array to from the carbon nanotube film. During the drawing step, the carbon nanotubes are joined end-to-end by van der Waals attractive force therebetween along the drawing direction. The carbon nanotube film has the smallest resistance along the drawing direction and the greatest resistance along a direction perpendicular to the drawing direction. Thus, the carbon nanotube film is resistance anisotropy. Furthermore, the carbon nanotube film can be etched or irradiated by laser. After being irradiated by laser, a plurality of parallel carbon nanotube conductive strings will be formed and the resistance anisotropy of the carbon nanotube film will not be damaged because the carbon nanotube substantially extending not along the drawing direction are removed by burning. Each carbon nanotube conductive string includes a plurality of carbon nanotubes joined end-to-end by van der Waals attractive force.

Figure 4:
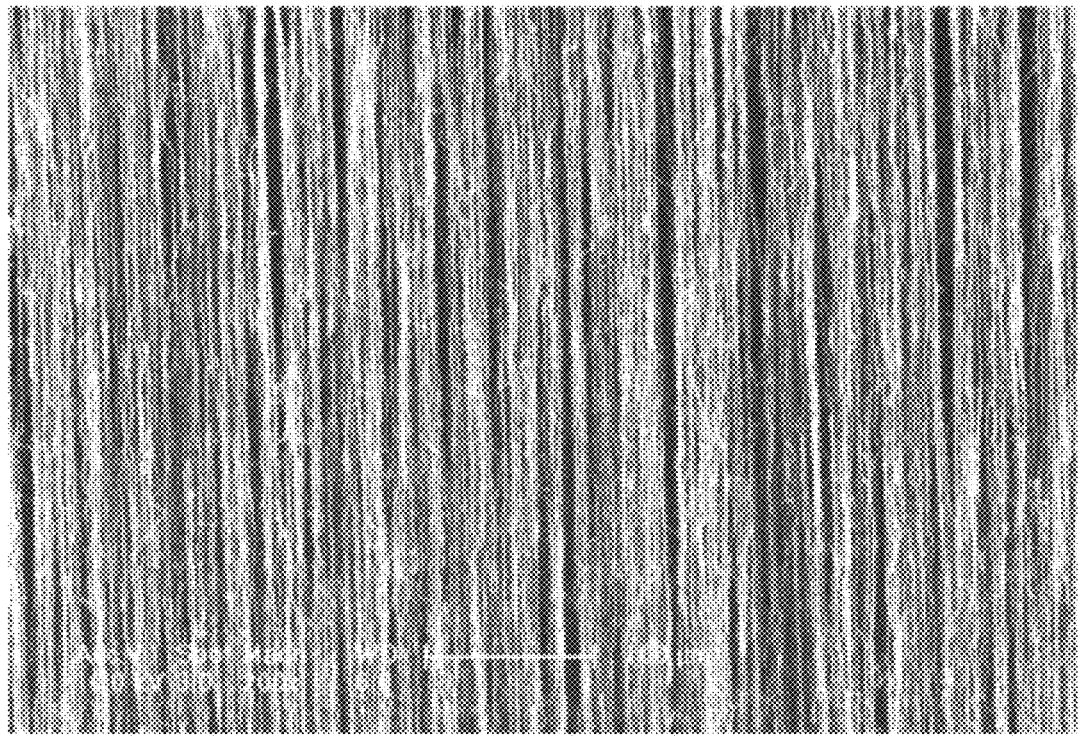
FIG. 4 is a Scanning Electron Microscope (SEM) image of a carbon nanotube film.

In one embodiment, the carbon nanotube layer 14 is a single carbon nanotube film. The carbon nanotube film includes a plurality of successive and oriented carbon nanotubes joined end-to-end by van der Waals attractive force therebetween. The carbon nanotube film is a free-standing film. Referring to FIG. 4, each carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. Some variations can occur in the carbon nanotube film. The carbon nanotubes in the carbon nanotube film are oriented along a preferred orientation. The carbon nanotube film can be treated with an organic solvent to increase the mechanical strength and toughness and reduce the coefficient of friction of the carbon nanotube film. A thickness of the carbon nanotube film can range from about 0.5 nanometers to about 100 micrometers.

The carbon nanotube layer 14 can include at least two stacked carbon nanotube films. In other embodiments, the carbon nanotube layer 14 can include two or more coplanar carbon nanotube films. Additionally, when the carbon nanotubes in the carbon nanotube film are aligned along one preferred orientation, an angle can exist between the orientations of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked carbon nanotube films is larger than 0 degrees, a plurality of micropores is defined by the carbon nanotube film. Stacking the carbon nanotube films will also add to the structural integrity of the carbon nanotube film.

After the carbon nanotube layer 14 is placed on the patterned adhesive layer 13, the part of the carbon nanotube layer 14 that corresponds to the patterned adhesive layer 13 can be infiltrated into the patterned adhesive layer 13. The part of the carbon nanotube layer 14 that does not correspond to the patterned adhesive layer 13 can be suspended. In one embodiment, the part of the carbon nanotube layer 14 that is on the patterned adhesive layer 13 has a first plurality of carbon nanotubes, infiltrated into the patterned adhesive layer 13, and a second plurality of carbon nanotubes, exposed through the patterned adhesive layer 13. Furthermore, a step of pressing the carbon nanotube layer 14 can be performed after step (S30) to allow more carbon nanotubes of the carbon nanotube layer 14 to infiltrate into the patterned adhesive layer 13.

In step (S40), the method for solidifying the patterned adhesive layer 13 depends on the material of the patterned adhesive layer 13. The thermoplastic patterned adhesive layer 13 can be solidified by partially cooling, the thermosetting patterned adhesive layer 13 can be solidified by partially heating by infrared radiation through a mask, and the UV glue patterned adhesive layer 13 can be solidified by partially irradiating with ultraviolet light. The patterned adhesive layer 13 can be irradiated for about 2 seconds to about 30 seconds by ultraviolet light. In one embodiment, the patterned adhesive layer 13 is irradiated for about 4 seconds. The part of the carbon nanotube layer 14 that corresponds to the patterned adhesive layer 13 will be fixed and form the fixed part 144 of the carbon nanotube layer 14. The part of the carbon nanotube layer 14 that does not correspond to the patterned adhesive layer 13 will form the non-fixed part 142 of carbon nanotube layer 14.

In step (S50), the non-fixed part 142 of carbon nanotube layer 14 can be removed by a method such as stripping by an adhesive tape or peeling by a roller having an adhesive outer surface. The non-fixed part 142 of carbon nanotube layer 14 can be removed easily by an adhesive tape or peeling by a roller having an adhesive outer surface. Also, the non-fixed part 142 of carbon nanotube layer 14 can be removed by a method such as laser-beam etching, ion-beam etching, or electron-beam etching. The fixed part 144 of the carbon nanotube layer 14 is maintained to form the patterned carbon nanotube layer 18. The pattern of the patterned carbon nanotube layer 18 is the same as that of the patterned adhesive layer 13.

Figure 5:
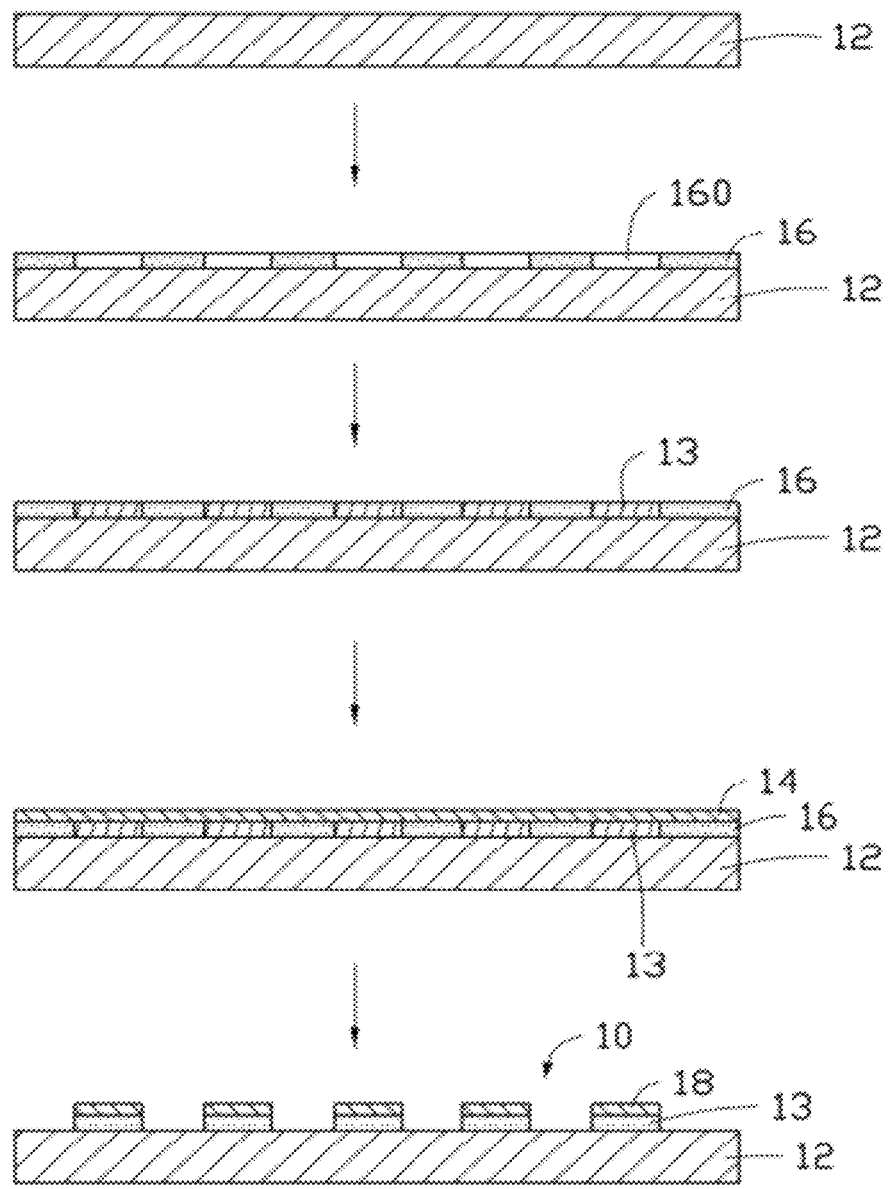
FIG. 5 is a flowchart of one embodiment of a method for making a patterned conductive element.

Referring to FIG. 5, a method for making the patterned conductive element 10 of another embodiment includes the steps of:

step (L10), providing a substrate 12;

step (L20), applying a first mask layer 16 on a surface of the substrate 12, wherein the first mask layer 16 defines a patterned openings 160 to expose part of the substrate 12;

step (L30), forming a patterned adhesive layer 13 on the substrate 12 and in the patterned openings 160;

step (L40), placing a carbon nanotube layer 14 on the patterned adhesive layer 13 and the first mask layer 16, and solidifying the patterned adhesive layer 13; and step (L50), removing the first mask layer 16 and the part of the carbon nanotube layer 14 that is on the first mask layer 16 to obtain a patterned carbon nanotube layer 18.

In step (L10), the substrate 12 is a flat glass plate.

In step (L20), the first mask layer 16 is a free-standing structure that can be easily peeled off as a whole from the substrate 12. The first mask layer 16 can be made of polymer such as PC, PMMA, PI, PET, PE, PES, PVC, BCB, polyesters, or acrylic resin. The thickness of the first mask layer 16 can be in a range from about 1 micrometer to about 10 micrometers. In one embodiment, the first mask layer 16 is a PET film frame with a thickness of about 1.5 micrometers. The pattern of the patterned openings 160 can be selected according to need. The patterned openings 160 is used to expose part of the substrate 12. In one embodiment, the patterned openings 160 includes a plurality of strip-shaped openings in parallel and spaced from each other.

In step (L30), the patterned adhesive layer 13 can be formed directly by spin-coating, spraying, or brushing. In one embodiment, a plurality of stripe-shaped UV glue layers is formed on the substrate 12 and in the patterned openings 160.

Figure 6:
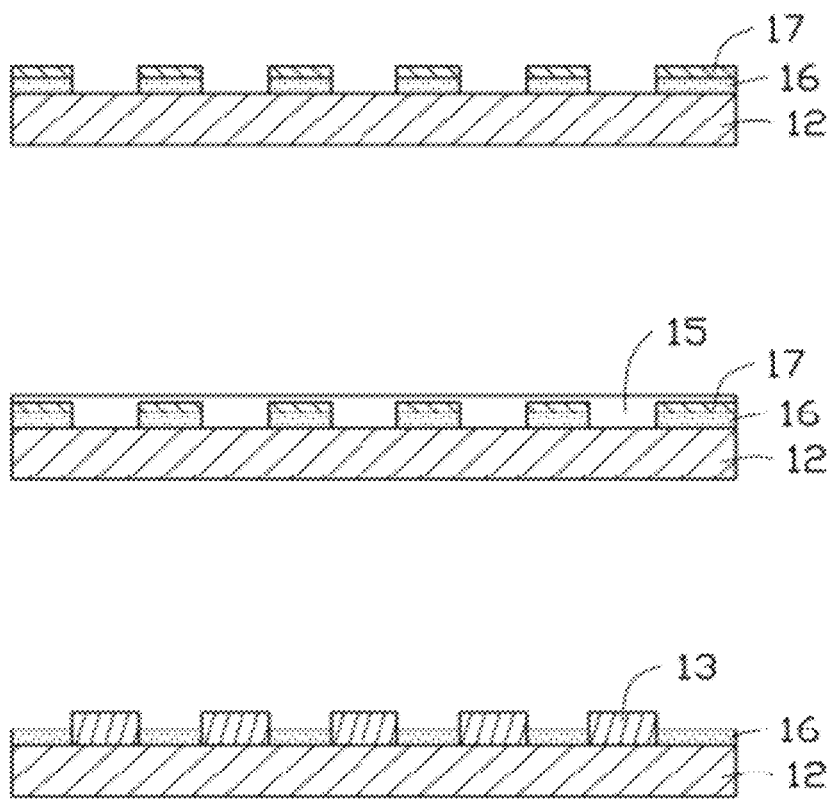
FIG. 6 is a flowchart of one embodiment of a method for making a patterned adhesive layer in the method of FIG. 5.

Referring to FIG. 6, the patterned adhesive layer 13 can be formed by following steps:

step (L301), applying a second mask layer 17 on the first mask layer 16;

step (L302), forming an adhesive layer 15 to cover the second mask layer 17 so that the patterned openings 160 are filled with adhesive layer 15; and step (L303), removing the second mask layer 17.

In step (L301), the second mask layer 17 defines a patterned opening (not labeled) corresponding to the patterned openings 160. In one embodiment, the material, the shape and area of the second mask layer 17 is same as that of the first mask layer 16. The thickness of the second mask layer 17 is less than that of the first mask layer 16.

In step (L302), the adhesive layer 15 can be formed by spin-coating, spraying, or brushing. The adhesive layer 15 can be formed both in the patterned openings 160 and on the second mask layer 17.

In step (L303), the part of the adhesive layer 15 that is on the second mask layer 17 is removed together with the second mask layer 17 so that the patterned adhesive layer 13 is obtained. Thus, no adhesive will be remained on the first mask layer 16.

In step (L40), the carbon nanotube layer 14 can be formed by transfer printing a preformed carbon nanotube film, filtering and depositing a carbon nanotube suspension, or laying a free-standing carbon nanotube film. In one embodiment, the carbon nanotube film is drawn from a carbon nanotube array and then placed on the patterned adhesive layer 13 directly. The method for solidifying the patterned adhesive layer 13 is the same as the method of step (S40) described above.

In step (L50), the entire first mask layer 16 is peeled off as a whole from the substrate 12. The part of carbon nanotube layer 14 that is on the first mask layer 16 is removed together with the first mask layer 16. The part of carbon nanotube layer 14 that is on the first mask layer 16 is fixed on the substrate 12 to form the patterned carbon nanotube layer 18. Because the patterned carbon nanotube layer 18 is fabricated easily by removing the first mask layer 16, the efficiency of making patterned conductive element 10 is improved. The first mask layer 16 and the second mask layer 17 can be recycled and the cost of the patterned conductive element 10 is decreased.

The patterned conductive element 10 fabricated by the above mentioned methods includes the substrate 12, the patterned adhesive layer 13, and the patterned carbon nanotube layer 18. The patterned adhesive layer 13 is located on the surface of the substrate 12. The patterned carbon nanotube layer 18 is located on the surface of the patterned adhesive layer 13 and fixed on the substrate 12 by the patterned adhesive layer 13. The patterned conductive element 10 can be applied in the electronic devices such as a touch screen, a solar cell, a LCD, or a FED.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a patterned conductive element, the method comprising:
   providing a substrate;
   applying a patterned adhesive layer on a surface of the substrate;
   placing a carbon nanotube layer on a surface of the patterned adhesive layer;
   solidifying the patterned adhesive layer to fix the carbon nanotube layer and obtain a fixed part of the carbon nanotube layer and a non-fixed part of carbon nanotube layer; and
   removing the non-fixed part of carbon nanotube layer.

2. The method of claim 1, wherein the patterned adhesive layer is formed by spin-coating, spraying, or brushing directly.

3. The method of claim 1, wherein the patterned adhesive layer is formed by coating a non-patterned adhesive layer to cover the entire substrate first and then removing part of the non-patterned adhesive layer.

4. The method of claim 1, wherein the patterned adhesive layer is a continuous integrated structure.

5. The method of claim 1, wherein the patterned adhesive layer comprises a plurality of adhesive units spaced from each other and arranged in the form of an array.

6. The method of claim 1, wherein the carbon nanotube layer is formed by filtering and depositing a carbon nanotube suspension.

7. The method of claim 1, wherein the carbon nanotube layer comprises a free-standing carbon nanotube film.

8. The method of claim 7, wherein the free-standing carbon nanotube film is drawn from a carbon nanotube array and laid on the patterned adhesive layer directly.

9. The method of claim 1, wherein after applying the carbon nanotube layer on the patterned adhesive layer, the carbon nanotube layer that is on the patterned adhesive layer comprises carbon nanotubes infiltrated into and extending out of the patterned adhesive layer.

10. The method of claim 1, further comprising pressing the carbon nanotube layer after applying the carbon nanotube layer on the patterned adhesive layer.

11. The method of claim 1, wherein the patterned adhesive layer comprises a thermosetting material and is solidified by heating.

12. The method of claim 1, wherein the patterned adhesive layer comprises UV glue and is solidified by ultraviolet light irradiating.

13. The method of claim 1, wherein the patterned adhesive layer comprises thermoplastic and is solidified by cooling.

14. The method of claim 1, wherein the non-fixed part of carbon nanotube layer is removed by stripping by an adhesive tape or peeling by a roller having an adhesive outer surface.

15. The method of claim 1, wherein the non-fixed part of carbon nanotube layer is removed by laser-beam etching, ion-beam etching, or electron-beam etching.

16. A method for making a patterned conductive element, the method comprising:
   providing a substrate;
   applying a first mask layer on a surface of the substrate, wherein the first mask layer defines a patterned opening to expose part of the substrate;
   forming a patterned adhesive layer on exposed part of the substrate;
   placing a carbon nanotube layer on the patterned adhesive layer and the first mask layer;
   solidifying the patterned adhesive layer; and
   removing the first mask layer and the part of the carbon nanotube layer that is on the first mask layer.

17. The method of claim 16, wherein the first mask layer is a free-standing structure and comprises a polymer.

18. The method of claim 16, further comprising placing a second mask layer to cover the first mask layer before applying the patterned adhesive layer and removing the second mask layer after applying the patterned adhesive layer.

19. The method of claim 16, wherein the first mask layer is peeled off as a whole.

20. The method of claim 19, wherein the part of the carbon nanotube layer that is on the first mask layer is removed together with the first mask layer.

* * * * *